United States Patent
Prasad et al.

(10) Patent No.: US 10,964,748 B1
(45) Date of Patent: Mar. 30, 2021

(54) ELECTRIC FIELD CONTROLLABLE SPIN FILTER TUNNEL JUNCTION MAGNETORESISTIVE MEMORY DEVICES AND METHODS OF MAKING THE SAME

(71) Applicant: Western Digital Technologies, Inc., San Jose, CA (US)

(72) Inventors: Bhagwati Prasad, San Jose, CA (US); Alan Kalitsov, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/686,917

(22) Filed: Nov. 18, 2019

(51) Int. Cl.
*H01L 27/22* (2006.01)
*H01L 43/10* (2006.01)
*G11C 11/16* (2006.01)

(52) U.S. Cl.
CPC .......... *H01L 27/222* (2013.01); *G11C 11/161* (2013.01); *H01L 43/10* (2013.01)

(58) Field of Classification Search
CPC ....... H01L 27/222; H01L 43/02; H01L 43/08; H01L 43/10; G11C 11/14–16; G11C 11/161
See application file for complete search history.

(56) References Cited

U.S. PATENT DOCUMENTS

| | | | |
|---|---|---|---|
| 6,166,947 A | 12/2000 | Asamitsu et al. | |
| 8,300,454 B2* | 10/2012 | Kramer | G11C 11/22 365/171 |
| 8,860,006 B2 | 10/2014 | Wang et al. | |
| 9,007,820 B2* | 4/2015 | Bibes | G11C 11/221 365/158 |
| 10,229,723 B1 | 3/2019 | Choi et al. | |
| 10,354,710 B2 | 7/2019 | Petti et al. | |
| 10,381,551 B1 | 8/2019 | Lille | |
| 2002/0048186 A1 | 4/2002 | Allenspach et al. | |
| 2002/0071303 A1 | 6/2002 | Kund et al. | |
| 2002/0175152 A1 | 11/2002 | Petrenko | |
| 2003/0024726 A1 | 2/2003 | Petrenko | |
| 2003/0024727 A1 | 2/2003 | Petrenko | |
| 2003/0151944 A1* | 8/2003 | Saito | H01L 27/228 365/173 |
| 2004/0165428 A1 | 8/2004 | Odagawa et al. | |
| 2006/0240992 A1 | 10/2006 | Brandt et al. | |

(Continued)

OTHER PUBLICATIONS

Notification of Transmittal of the International Search Report and Written Opinion of the International Search Authority or International Patent Application No. PCT/US2020/025612, dated Aug. 7, 2020, 13 pages.

(Continued)

*Primary Examiner* — Allison Bernstein
(74) *Attorney, Agent, or Firm* — The Marbury Law Group PLLC

(57) ABSTRACT

A magnetoresistive memory device includes a first electrode, a second electrode, and a layer stack containing an electric field-modulated magnetic transition layer and a ferroelectric insulator layer located between the first electrode and the second electrode. The electric field-modulated magnetic transition layer includes a non-metallic magnetic material having a ferromagnetic state and a non-ferromagnetic state with a state transition therebetween that depends on an external electric field.

20 Claims, 13 Drawing Sheets

(56) References Cited

U.S. PATENT DOCUMENTS

2016/0020382 A1 1/2016 Levy et al.
2018/0287052 A1 10/2018 Wang et al.

OTHER PUBLICATIONS

I. Stolichnov, et al. "Nonvolatile ferroelectric control of ferromagnetism in (Ga,Mn)As" available online at https://arxiv.org/ftp/arxiv/papers/0802/0802.2074.pdf, 19 pages. May 4, 2008, 464.

V. Garcia et al. "Ferroelectric Control of Spin Polarization" Science, Feb. 26, 2010, vol. 327, p. 1106, 6 pages.

U.S. Appl. No. 16/024,490, filed Jun. 29, 2018, SanDisk Technologies LLC.

U.S. Appl. No. 16/212,257, filed Dec. 6, 2018, SanDisk Technologies LLC.

U.S. Appl. No. 16/212,342, filed Dec. 6, 2018, SanDisk Technologies LLC.

U.S. Appl. No. 16/212,420, filed Dec. 6, 2018, SanDisk Technologies LLC.

U.S. Appl. No. 16/212,132, filed Dec. 6, 2018, SanDisk Technologies LLC.

U.S. Appl. No. 16/422,187, filed May 24, 2019, SanDisk Technologies LLC.

U.S. Appl. No. 16/401,172, filed May 2, 2019, Western Digital Technologies, Inc.

U.S. Appl. No. 16/419,243, filed May 22, 2019, SanDisk Technologies LLC.

U.S. Appl. No. 16/442,858, filed Jun. 17, 2019, Western Digital Technologies, Inc.

U.S. Appl. No. 16/558,552, filed Sep. 3, 2019, Western Digital Technologies, Inc.

U.S. Appl. No. 16/666,967, filed Oct. 29, 2019, SanDisk Technologies LLC.

Y.Yamada, et al., "Electrically induced ferromagnetism at room temperature in cobalt-doped titanium dioxide", Science. May 27, 2011; 332(6033):1065-7. Downloaded from http://science.sciencemag.org/ on Nov. 19, 2019, 4 pages.

U.S. Appl. No. 16/686,860, filed Nov. 18, 2019, assigned to SanDisk Technologies LLC.

USPTO Office Communication, Non Final Office Action for U.S. Appl. No. 16/686,860, dated Sep. 3, 2020, 17 pages.

* cited by examiner

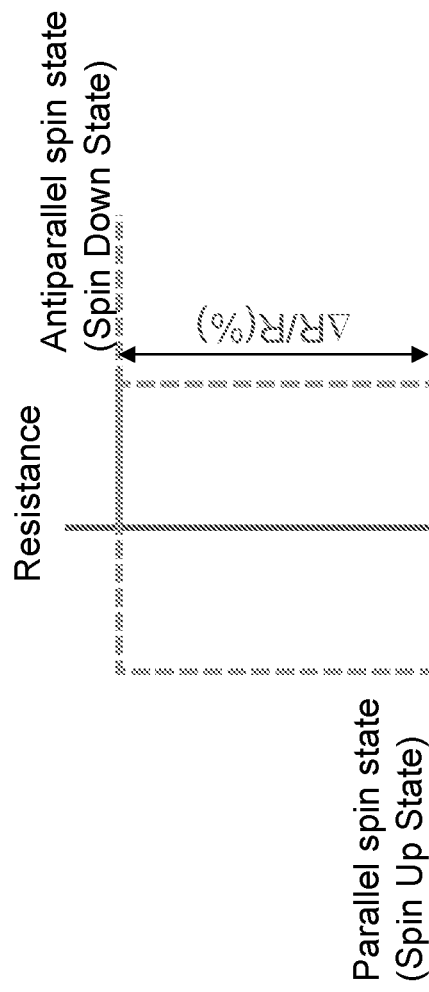
FIG. 4B
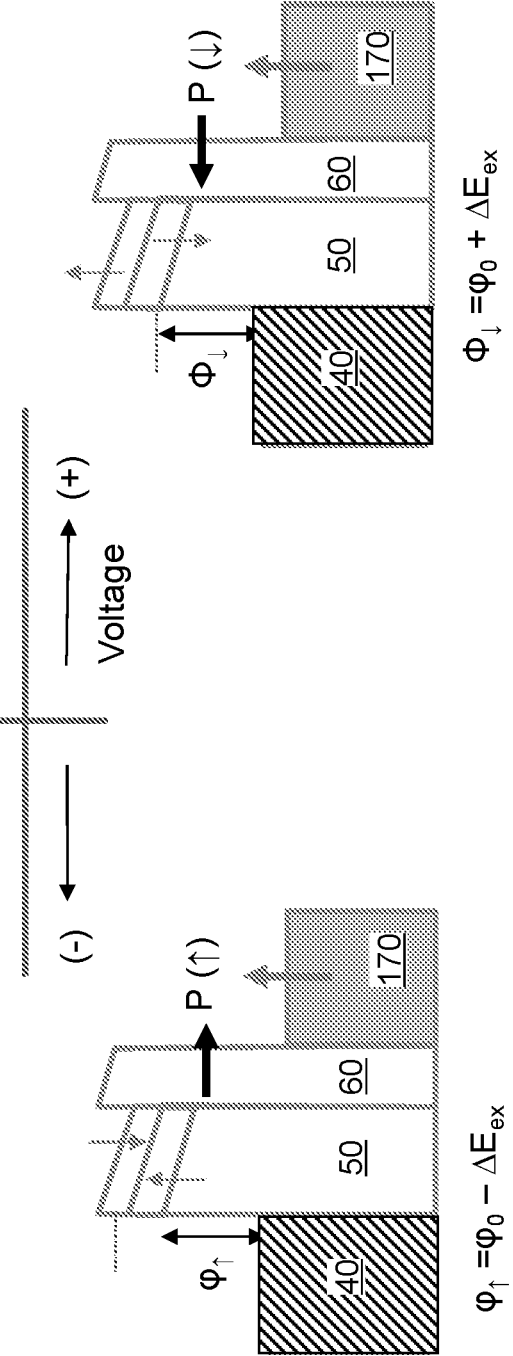
FIG. 4D
FIG. 4C though such memory device would be classified as a resistive random access memory device, it is called a magnetoresistive memory device in the present disclosure because the resistance of each memory cell can be modulated due to a change in the magnetic state of the electric field-modulated magnetic transition layer. The various aspects of embodiments of the disclosure are now described with reference to the accompanying drawings.

ELECTRIC FIELD CONTROLLABLE SPIN FILTER TUNNEL JUNCTION MAGNETORESISTIVE MEMORY DEVICES AND METHODS OF MAKING THE SAME

FIELD

The present disclosure relates generally to the field of magnetic memory devices and specifically to magnetoresistive memory devices using electric field-induced tunneling barrier modulation and methods of making the same.

BACKGROUND

A magnetoresistive memory device is a memory device in which a magnetic state of a memory material provides at least two resistive states. The magnetic state of a memory cell can be sensed by measuring the resistance of the memory cell under a small external voltage bias. Generally, a stack containing a free ferromagnetic material layer and a reference ferromagnetic material layer separated by a spacer tends to provide a low resistance state when the free and reference layer magnetization directions are parallel, and a high resistance state when the magnetization directions are antiparallel. For example, spin-transfer torque (STT) magnetoresistive memory devices employ spin-polarized current to program the magnetization direction of the free layer, and spin-orbit-torque (SOT) magnetoresistive devices employ injection of a spin-polarized current from an adjacent conductive layer. A general challenge for magnetoresistive devices is the reduction of switching power, i.e., the power required to induce transition from one magnetoresistive state to another magnetoresistive state.

SUMMARY

According to an aspect of the present disclosure, a magnetoresistive memory device includes a first electrode, a second electrode, and a layer stack containing an electric field-modulated magnetic transition layer and a ferroelectric insulator layer located between the first electrode and the second electrode, The electric field-modulated magnetic transition layer includes a non-metallic magnetic material having a ferromagnetic state and a non-ferromagnetic state (such as a paramagnetic state, a diamagnetic state, or an anti-ferromagnetic state) with a state transition therebetween that depends on an external electric field.

According to another aspect of the present disclosure, the magnetoresistive memory device can be programmed by inducing a state transition between the ferromagnetic state and the non-ferromagnetic state in the electric field-modulated magnetic transition layer by applying a voltage between the first electrode and the second electrode to generate the external electric field.

According to yet another aspect of the present disclosure, a magnetoresistive memory device includes a first electrode, a second electrode comprising a ferromagnetic metallic material, and a layer stack including an electric field-modulated magnetic transition layer and a ferroelectric insulator layer, wherein the electric field-modulated magnetic transition layer includes a non-metallic magnetic material which has a magnetic state transition that depends on an external electric field.

According to another aspect of the present disclosure, the magnetoresistive memory device can be programmed by inducing the magnetic state transition in the electric field-modulated magnetic transition layer by applying a voltage between the first electrode and the second electrode to generate the electric field.

BRIEF DESCRIPTION OF THE DRAWINGS

FIG. 4B a voltage-resistance curve for the second exemplary magnetoresistive memory cell of FIG. 4A.

FIGS. 4C and 4D illustrate energy band diagrams for the second exemplary magnetoresistive memory cell in two different resistance states.

DETAILED DESCRIPTION

Figure 1A:
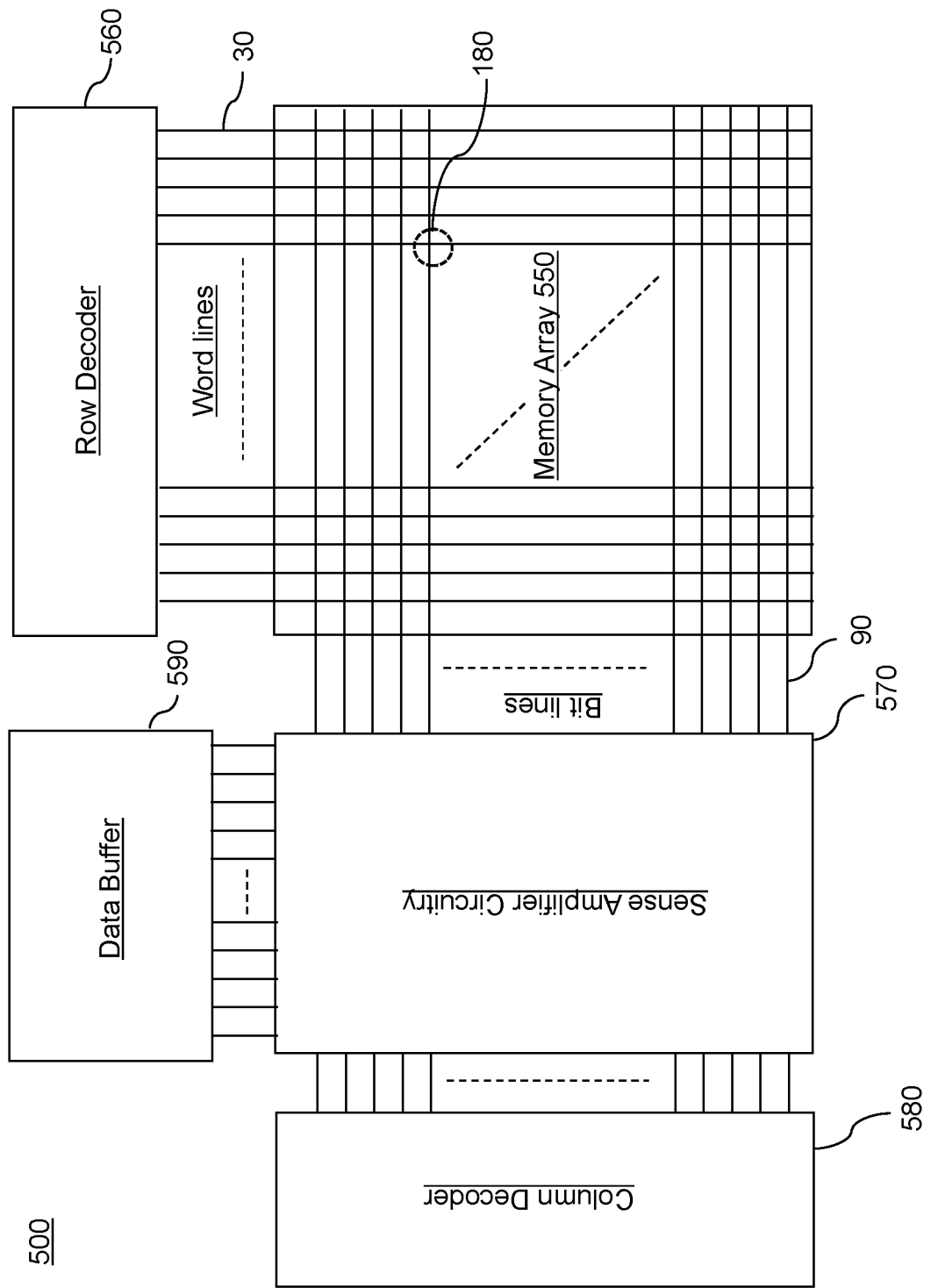
FIG. 1A is a schematic diagram of a memory device including resistive memory units of the present disclosure in an array configuration.

As discussed above, the embodiments present disclosure is directed to spin filter tunnel junction (SFTJ) type magnetoresistive memory devices which utilize electric field-induced tunneling barrier modulation for programming the devices into the lower and higher resistivity states, and methods of making and operating the same, the various aspects of which are described below.

According to an aspect of the present disclosure, switching the magnetization of the tunnel barrier uses an electric field induced effect. A memory cell includes an electric field-modulated magnetic transition layer (e.g., tunnel barrier) and a ferroelectric insulator layer. A voltage generated electric field is used to trigger an electric field-induced change in the magnetic property in the electric field-modulated magnetic transition layer. The ferroelectric insulator layer located adjacent to the non-metallic magnetic material is used to hold the applied electric field (nonvolatile in nature) after the applied voltage is switched off. Specifically, a nonmetallic magnetic material, such as semiconductor magnetic material, displaying a ferromagnetic state and a non-ferromagnetic state (such as a paramagnetic state, a diamagnetic state, or an antiferromagnetic state) depending on external electric field may be used as the electric field-modulated magnetic transition layer (e.g., tunnel barrier).

The electric field-modulated magnetic transition layer displays different energy barrier profiles (e.g., heights) depending on its magnetic state, and the changes in the magnetoresistance of the memory cell may be utilized to store data bits. A layer stack of the electric field-modulated magnetic transition layer and the ferroelectric insulator layer may be used alone to store a single binary bit having two possible states, or may be used in conjunction with a spin-torque transfer (STT) element (e.g., one or more metallic ferromagnetic layers) to store a ternary bit, a quaternary bit, or a quinary bit.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1A, a schematic diagram is shown for a random access memory (RAM) device 500 including resistive memory units 180 that are arranged in an array configuration. A random access memory device refers to a memory device containing memory cells that allow random access, e.g., access to any selected memory cell upon a suitable selection command for programming, erasing, and/or sensing.

The RAM device 500 (e.g., MRAM device) includes a memory array region 550 containing an array of resistive memory units 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The resistive memory units 180 may include or consist of a memory cell (e.g., MRAM cell) and optionally an additional selector (i.e., steering) element. The RAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Each of the resistive memory units 180 can be a two-terminal device including a respective first electrode and a respective second electrode. Multiple instances of the resistive memory units 180 are provided in an array configuration in the memory array region 550. In one embodiment, the array of resistive memory units 180 can be arranged as an M×N rectangular array including M rows and N columns. M row access transistors and N column access transistors may be provided to access any selected resistive memory unit 180 in the memory array region 550.

Figure 1B:
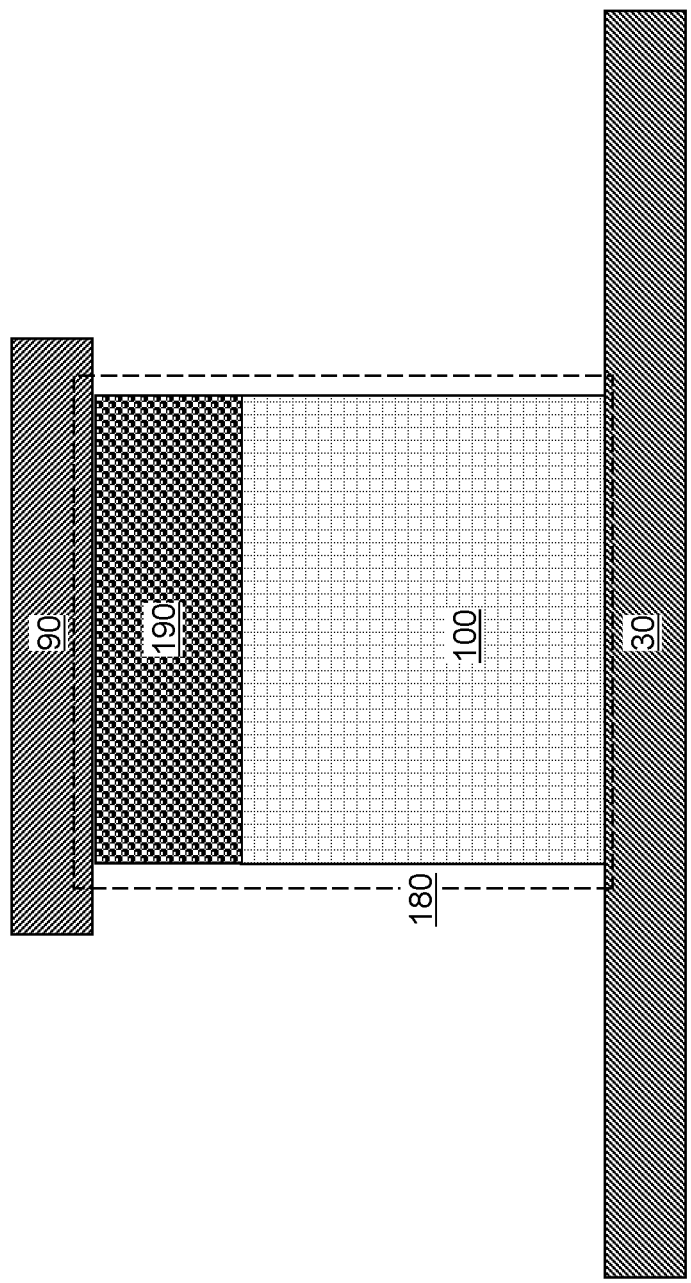
FIG. 1B is a cross-sectional view of a resistive memory unit including a series connection of a magnetoresistive memory cell and an optional selector element within the memory device of FIG. 1A.

In case the array of resistive memory units 180 is arranged as an M×N rectangular array, each resistive memory unit 180 can include a series connection of a magnetoresistive memory cell (e.g., MRAM cell) 100 and an optional selector element 190 as illustrated in FIG. 1B. Each selector element 190 (if present in the unit 180) may be provided in a series connection with a magnetoresistive memory cell 100 in each resistive memory unit 180. The selector element 190 may be provided between the magnetoresistive memory cell 100 and a respective one of the first electrically conductive lines 30, or between the magnetoresistive memory cell 100 and a respective one of the second electrically conductive lines 90.

A selector element is a material portion including a selector material. As used herein, a "selector material" refers to any material that can function as a steering element which either allows or blocks current from passing through the memory cell depending on the magnitude and/or the direction of the bias voltage applied across the selector material. The selector material layer can include a non-Ohmic material that provides electrical connection or electrical isolation depending on the magnitude and/or the polarity of an externally applied voltage bias thereacross. In one embodiment, the selector material layer includes at least one threshold switch material layer. The at least one threshold switch material layer includes any suitable threshold switch material which exhibits non-linear electrical behavior, such as an ovonic threshold switch (OTS) material or a conductive bridge material. As used herein, an ovonic threshold switch is a device that does not crystallize in a low resistivity state under a voltage above the threshold voltage, and reverts back to a high resistivity state when not subjected to a voltage above the critical holding voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material layer can include, and/or can consist essentially of, a material selected from a GeSeAs alloy, a GeTeAs, a GeSeTeSe alloy, a GeSe alloy, a SeAs alloy, a GeTe alloy, and a SiTe alloy.

As used herein, a conductive bridge material, or a "programmable metallization" material refers to a material the employs a reversible electrochemical metallization process that utilizes redox reactions to form and to dissolve a conductive filament. The state of the conductive bridge material is determined by the resistance of the conductive bridge material. The existence of conductive filaments in the conductive bridge material produces a low resistance state, and the absence of conductive filament produces a high resistance state. The conductive bridge material, can include a layer stack of a first metal electrode layer including an electrochemically active metal (such as silver or copper), a thin solid electrolyte layer, and a second metal electrode layer including a chemically inert metal (such as tungsten to nickel). The resistive state of the conductive bridge material can be determined by forming or dissolving metallic conductive filaments between the first metal electrode layer and the second metal electrode layer. The metallic conductive filaments can be formed by applying a positive voltage bias to the first metal electrode layer including an active metal (which is referred to as an anode layer) relative to the second metal electrode layer. The positive bias ionizes the active metal (M) into positive ions, and the ionized active metal migrates toward the second metal electrode layer due to the external electric field generated by the voltage bias across the first metal electrode layer and the second metal electrode layer. The positive metal ions are reduced at the second metal electrode layer, and become electrically neutral metal atoms. As the active metal atoms are deposited on the second metal electrode layer, the electric field strength between the first metal electrode layer and the second metal electrode layer increases, and conductive metal filaments are formed in the solid electrolyte layer. The conductive metal filaments can be removed by applying a reverse bias across the first metal electrode layer and the second metal electrode layer. In this case, the neutral metal atoms in the conductive metal filaments are converted into positive metal ions that migrate to the first metal electrode layer, and the conductive metal filaments are removed, thereby causing the conductive bridge material to be in a high resistive state.

In one embodiment, the material of the selector material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer can be selected such that the critical bias voltage magnitude can be in a range from 0.1 V to 6 V, although lesser and greater voltages can also be employed for the critical bias voltage magnitude.

Alternatively, an array of resistive memory elements may be formed in different configurations. For example, a one-transistor one-memory-cell (1T1M) configuration can be employed to provide a P×Q rectangular array of magnetoresistive memory cells. In this case, the total number of the access transistors can be the same as the total number of the magnetoresistive memory cells 100 (which is the same as the product of P and Q), and selector elements are not necessary. Further, a resistive memory unit 180 may be manufactured as a discrete device, i.e., a single isolated device.

Figure 2:
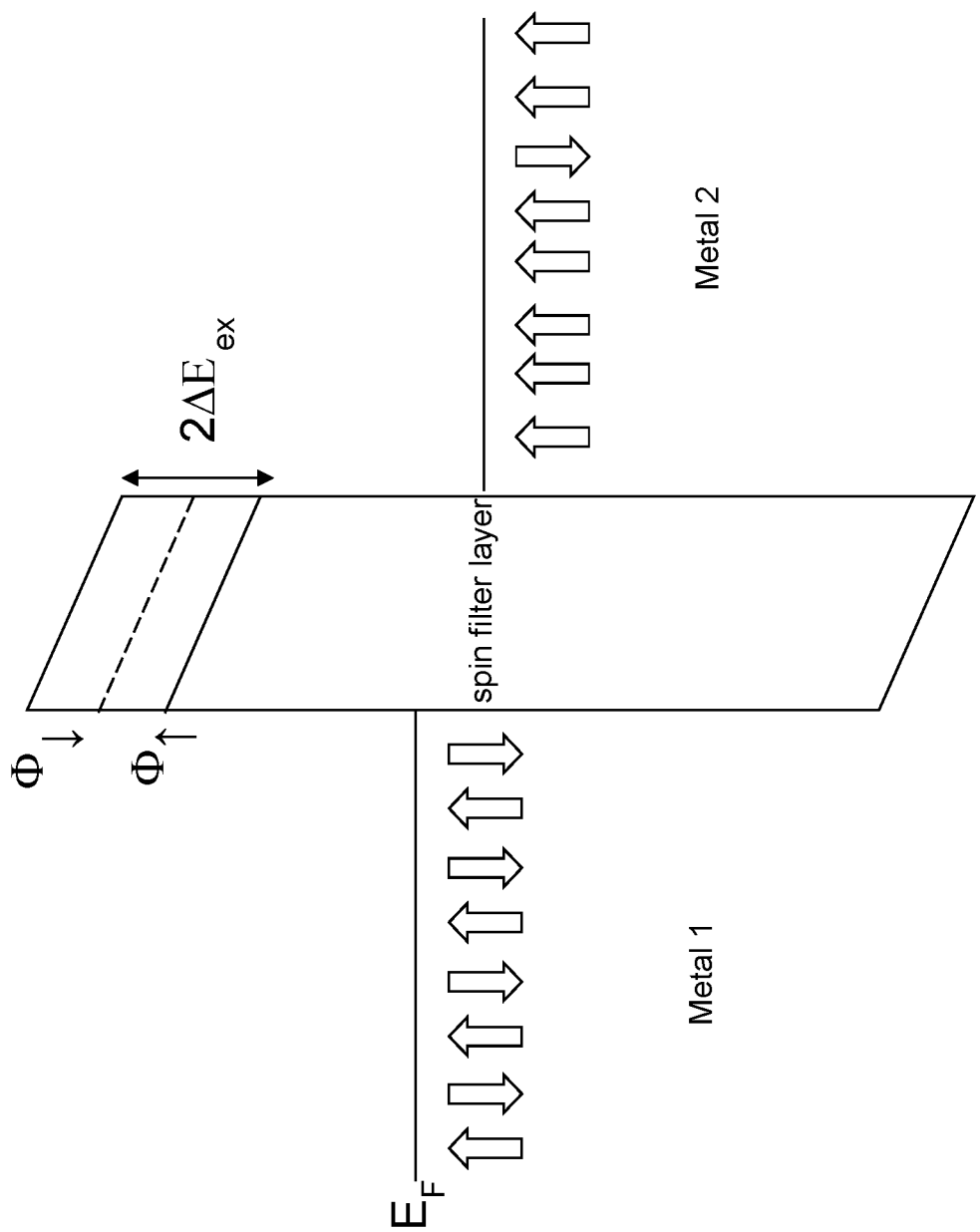
FIG. 2 illustrates a spin filter tunnel junction according to an embodiment of the present disclosure.

The magnetoresistive memory cell 100 of the embodiments of the present disclosure can be provided in various configurations, the details of which are described in detail below. The magnetoresistive memory cell 100 of the embodiments present disclosure incorporates a spin filter tunnel junction (SFTJ). FIG. 2 illustrates a spin filter tunnel junction that includes a layer stack of a first metal (metal 1), a spin filter layer, and second metal (metal 2). In a non-metallic magnetic material that has a ferromagnetic state and a non-ferromagnetic state (such as a paramagnetic state, a diamagnetic state, or an antiferromagnetic state), electron tunneling through the non-metallic material depends on the height of the energy barrier for electrons. As used herein, a "magnetic material" refers to a material that exhibits ferromagnetism at a device operating temperature, which may a temperature in a range from −40 degrees Celsius to 100 degrees Celsius, such as room temperature (i.e., 20 degrees Celsius). A "non-metallic magnetic material" refers to a magnetic material that is not metallic, i.e., a magnetic material that does not have a partially filled conduction band, such as a semiconductor magnetic material.

The tunneling current density J through the non-metallic magnetic material is proportional to $\exp[-d\Phi^{1/2}]$, in which d is the barrier thickness and $\Phi$ is the energy barrier in the non-metallic material. The energy barrier in the non-metallic magnetic material in a non-ferromagnetic state (such as a paramagnetic state, a diamagnetic state or an antiferromagnetic state) can be given by $\Phi_0$. Once the non-metallic magnetic material transitions to a ferromagnetic state, the energy barrier (e.g., the conduction band) in the non-metallic material splits into two levels, which are given by $\Phi_\uparrow = \Phi_0 - \Delta E_{ex}$ and $\Phi_\downarrow = \Phi_0 + \Delta E_{ex}$, in which $\Phi_\uparrow$ refers to the energy barrier for a first electron spin state (which has a spin alignment with respect to the magnetization direction of the ferromagnetic non-metallic material that produces a lower energy barrier), $\Phi_\downarrow$ refers to the energy barrier for a second electron spin state (which has a spin alignment with respect to the magnetization direction of the ferromagnetic non-metallic material that produces a higher energy barrier), $\Delta E_{ex}$ refers to exchange splitting of the conduction band due to the interaction of the spins of the electrons and the magnetization of the ferromagnetic state of the non-metallic magnetic material. In other words, the energy barrier for the second electron spin state can be higher than the energy barrier for the first electron spin state by $2\Delta E_{ex}$. Thus, electrons with the first electron spin state can pass through the non-metallic magnetic material in the ferromagnetic state with significantly lower tunneling resistance than electrons with the second electron spin state, and the electrical current passing through the non-metallic magnetic material can be spin-polarized. Thus, the non-metallic magnetic material in the ferromagnetic state functions as a spin filter layer, or a spin filter tunnel junction. The spin polarization $P_s$ of the electrical current through the spin filter tunnel junction is given by: $P_s=|J_\uparrow-J_\downarrow|/(J_\uparrow+J_\downarrow)$. Likewise, electrons with the first electron spin state can pass through the non-metallic magnetic material when it is in the ferromagnetic state with significantly lower tunneling resistance than when the non-metallic magnetic material is in the non-ferromagnetic state (such as a paramagnetic state, a diamagnetic state or an antiferromagnetic state). Thus, the state of the non-metallic magnetic material may be used to store a data bit depending on whether it is in the ferromagnetic state (which corresponds to the lower resistivity state) or in the non-ferromagnetic state (which corresponds to the higher resistivity state).

According to an aspect of the present disclosure, the spin filter tunnel junction of the embodiments of the present disclosure is configured to be activated by an applied voltage which generates an electric field that triggers a state transition between a non-ferromagnetic state (such as a paramagnetic state, a diamagnetic state or an antiferromagnetic state) and a ferromagnetic state within the non-metallic magnetic material. Thus, the non-metallic magnetic material is used as a barrier in the spin filter tunnel junction and the change between the non-ferromagnetic and the ferromagnetic state (e.g., phase) of the material changes based on the applied voltage, which may be a positive or a negative voltage depending on the material and source of ferromagnetism in the material. The ferroelectric insulator layer located adjacent to the non-metallic magnetic material is used to hold the applied electric field (nonvolatile in nature) after the applied voltage is switched off.

Figure 3A:
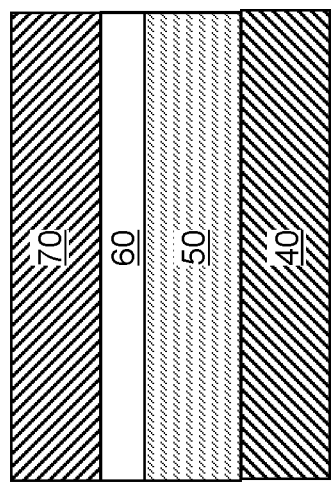
FIG. 3A illustrates a first exemplary magnetoresistive memory cell according to a first embodiment of the present disclosure.

Referring to FIG. 3A, a first exemplary magnetoresistive memory cell 100A according to a first embodiment of the present disclosure is illustrated. The first exemplary magnetoresistive memory cell 100A is a memory cell in a magnetoresistive memory device. Specifically, the first exemplary magnetoresistive memory cell 100A can include a first electrode 40 including, and/or consisting essentially of, a first metal, a second electrode 70 including, and/or consisting essentially of, a second metal and spaced from the first electrode 40, and a layer stack (50, 60) including an electric field-modulated magnetic transition layer 50 and a ferroelectric insulator layer 60 located between the first and the second electrodes. In one embodiment, the electric field-modulated magnetic transition layer 50 physically contacts the ferroelectric insulator layer 60. The electric field-modulated magnetic transition layer 50 may contact or be located adjacent to the first electrode 40. The ferroelectric insulator layer 60 may contact or be located adjacent to the second electrode 70. Alternatively, the positions of the electric field-modulated magnetic transition layer 50 and the ferroelectric insulator layer 60 may be reversed, such as the ferroelectric insulator layer 60 may contact or be located adjacent to the first electrode 40, and the electric field-modulated magnetic transition layer 50 may contact or be located adjacent to the second electrode 70. In this embodiment, the first and the second electrodes may comprise or consist of a non-magnetic, electrically conductive material, such as a metal or metal alloy, for example tungsten, copper, molybdenum, ruthenium, cobalt, titanium, tantalum, titanium nitride, tantalum nitride, tungsten nitride, or combinations thereof.

In one embodiment, the electric field-modulated magnetic transition layer 50 includes a non-metallic magnetic material having a ferromagnetic state and a non-ferromagnetic state with a state transition therebetween that depends on an external electric field. As used herein, a "non-ferromagnetic state" refers to any magnetic state that is not a ferromagnetic state, and may include a paramagnetic state, a diamagnetic state, an antiferromagnetic state, or any other magnetic state that does not have any remanent magnetization in the absence of an applied magnetic field. The electric field-modulated magnetic transition layer 50 can include a semiconductor material or an insulator material.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "metallic material" refers to a conductive material including at least one metallic element therein. All measurements for electrical conductivities are made at the standard condition.

In one embodiment, the non-metallic magnetic material comprises, and/or consists essentially of, a compound semiconductor material. The electric field-modulated magnetic transition layer 50 can be provided in the form of a thin film having a thickness in a range from 0.5 nm to 10 nm, such as from 0.5 nm to 5 nm, such as from 1 nm to 4 nm.

In one embodiment, the non-metallic magnetic material of the electric field-modulated magnetic transition layer 50 can comprise, and/or can consist essentially of, a III-V compound semiconductor material. In one embodiment, the non-metallic magnetic material comprises manganese-doped gallium arsenide, which can provide a ferromagnetic state and a paramagnetic state. For example, the composition of the manganese-doped gallium arsenide may be $Ga_{1-\delta}Mn_{\delta}As$, in which $\delta$ is in a range from 0.03 to 0.12. In another embodiment, the non-metallic magnetic material comprises manganese-doped indium arsenide or indium antimonide.

In another embodiment, the non-metallic magnetic material of the electric field-modulated magnetic transition layer 50 can comprise, and/or can consist essentially of, a lanthanide chalcogenide semiconductor material. The lanthanide chalcogenide semiconductor material may include europium oxide, europium selenide or europium sulfide which can provide a ferromagnetic state and a non-ferromagnetic state (such as a paramagnetic state, a diamagnetic state or an antiferromagnetic state).

In another embodiment, the non-metallic magnetic material of the electric field-modulated magnetic transition layer 50 can comprise, and/or can consist essentially of, a doped transition metal oxide material, which may be a wide band gap semiconductor or an insulating material, depending on the width of the band gap. In one embodiment, the non-metallic magnetic material comprises cobalt-doped or iron-doped titanium oxide (having a rutile or anatase phase), or cobalt-doped, lanthanide element-doped or manganese-doped zinc oxide. Other metal oxide or metal nitride (e.g., manganese and/or iron-doped indium oxide, chromium-doped aluminum nitride, etc.) materials may also be used.

The ferroelectric insulator layer 60 can be located in contact with the electric field-modulated magnetic transition layer 50. The ferroelectric insulator layer 60 can have ferroelectric polarization with a polarization direction that is perpendicular to an interface between the ferroelectric insulator layer 60 and the electric field-modulated magnetic transition layer 50. A ferroelectric material having a stable polarization at a thickness less than 50 nm, such as less than 10 nm, including 0.5 nm to 5 nm may be used for the ferroelectric insulator layer 60. In an illustrative example, the ferroelectric insulator layer 60 comprises, and/or consists essentially of, hafnium oxide or zirconium doped hafnium oxide having a ferroelectric non-centrosymmetric orthorhombic phase. Alternatively, other ferroelectric materials, such as barium titanate, bismuth ferrite, lead titanate, lead zirconate titanate, etc., may be used. In one embodiment, the ferroelectric insulator layer 60 can have a thickness in a range from 0.5 nm to 5 nm, such as 1 nm to 2 nm.

In one embodiment, the non-metallic magnetic material of the electric field-modulated magnetic transition layer 50 and the ferroelectric material of the ferroelectric insulator layer 60 can be selected such that the non-metallic magnetic material of layer 50 is in the non-ferromagnetic state under a condition in which remanent polarization direction within the ferroelectric insulator layer 60 points toward from the electric field-modulated magnetic transition layer 50. In the convention used in FIGS. 3C and 3D, the polarization direction points from the negative electrode to the positive electrode. Without wishing to be bound by a particular theory, it is believed that if negative surface charges (i.e., electrons) are present in layer 60 in proximity to the interface with the electric field-modulated magnetic transition layer 50 due to the ferroelectric polarization of the layer 60, then these negative surface charges may generate holes in the electric field-modulated magnetic transition layer 50 (at least near the interface). This may reduce the electron density at least near the interface in the electric field-modulated magnetic transition layer 50. The reduction in the electron density induces the non-ferromagnetic state in the electric field-modulated magnetic transition layer 50, as shown in FIG. 3D.

Further, the non-metallic magnetic material of layer 50 can be in the ferromagnetic state under a condition in which the remanent polarization within the ferroelectric insulator layer 60 points away from the electric field-modulated magnetic transition layer 50. Without wishing to be bound by a particular theory, it is believed that if positive surface charges (i.e., holes) are present in layer 60 in proximity to the interface with the electric field-modulated magnetic transition layer 50 due to the opposite ferroelectric polarization of the layer 60, then these positive surface charges may generate electrons in the electric field-modulated magnetic transition layer 50 (at least near the interface). This may increase the electron density at least near the interface in the electric field-modulated magnetic transition layer 50. The increase in the electron density induces the ferromagnetic state in the electric field-modulated magnetic transition layer 50, including the conduction band splitting shown in FIG. 3C.

In one embodiment, the first metal of the first electrode 40 can comprise, and/or can consist essentially of, a first non-ferromagnetic metal such as tungsten, copper, molybdenum, ruthenium, cobalt, titanium, tantalum, titanium nitride, tantalum nitride, tungsten nitride, or combinations thereof. The second metal of the second electrode 70 can comprise, and/or can consist essentially of, a second non-ferromagnetic metal, which can be any of the metals that may be employed for the first non-ferromagnetic metal. The second non-ferromagnetic metal may be the same as, or may be different from, the first non-ferromagnetic metal.

The state transitions between the ferromagnetic state and the non-ferromagnetic state within the electric field-modulated magnetic transition layer 50 can occur with hysteresis as a function of a voltage across (i.e., between) the first electrode 40 and the second electrode 70.

Figure 3B:
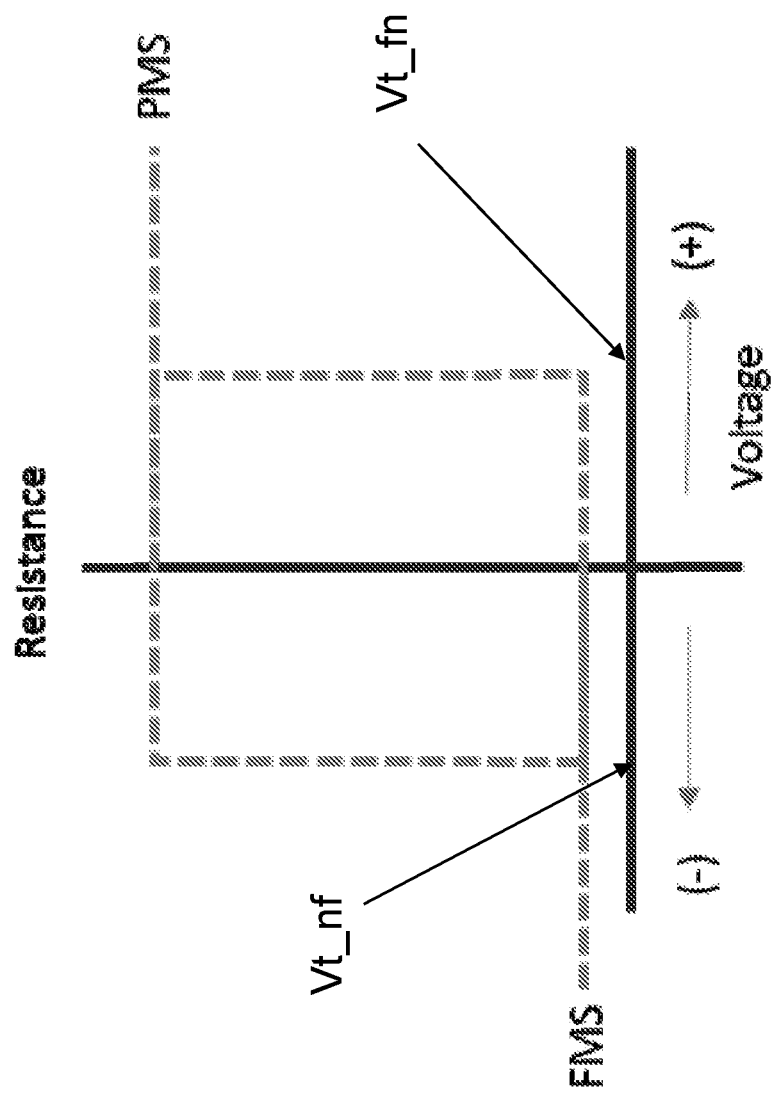
FIG. 3B is a voltage-resistance curve for the first exemplary magnetoresistive memory cell of FIG. 3A.
Figures 3C, 3D:
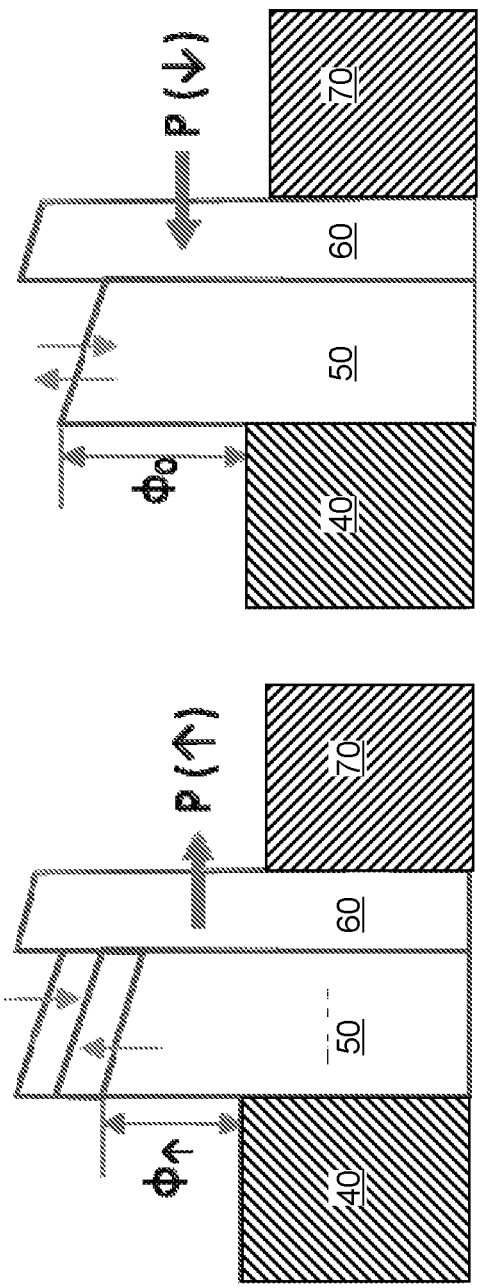
FIG. 3C illustrates an energy band diagram for the first exemplary magnetoresistive memory cell while the electric field-modulated magnetic transition layer is in a ferromagnetic state.
FIG. 3D illustrates an energy band diagram for the first exemplary magnetoresistive memory cell while the electric field-modulated magnetic transition layer is in a non-ferromagnetic state.

FIG. 3B illustrates an exemplary voltage-resistance curve for the first exemplary magnetoresistive memory cell 100A of FIG. 3A, which shows electrical-field induced state transitions in the electric field-modulated magnetic transition layer 50 as a function of the voltage across (i.e., between) the first electrode 40 and the second electrode 70. Specifically, the horizontal voltage axis shows the voltage applied to the first electrode 40 which is located adjacent to the electric field-modulated magnetic transition layer 50. The electric field-modulated magnetic transition layer 50 is in the lower resistivity ferromagnetic state shown in FIG. 3C when the first voltage V1 at the first electrode 40 is sufficiently negative with respect to the second voltage V2 at the second electrode 70 (i.e., when a negative voltage is applied to the first electrode 40 located adjacent to the electric field-modulated magnetic transition layer 50 and a positive voltage is applied to the second electrode 70 located adjacent to the ferroelectric insulator layer 60).

The electric field-modulated magnetic transition layer 50 is in the higher resistivity non-ferromagnetic state (such as a paramagnetic state, a diamagnetic state or an antiferromagnetic state) shown in FIG. 3D when the first voltage V1 at the first electrode 40 is sufficiently positive with respect to the second voltage V2 at the second electrode 70 (i.e., when a positive voltage is applied to the first electrode 40 located adjacent to the electric field-modulated magnetic transition layer 50 and a negative voltage is applied to the second electrode 70 located adjacent to the ferroelectric insulator layer 60). The magnetic state of the electric field-modulated magnetic transition layer 50 displays a hysteresis effect between a ferromagnetic-to-non-ferromagnetic transition voltage Vt_fn at which a magnetic transition occurs from the ferromagnetic state to the non-ferromagnetic state (such as a paramagnetic state, a diamagnetic state or an antiferromagnetic state), and a non-ferromagnetic-to-ferromagnetic transition voltage Vt_nf at which a magnetic transition occurs from the non-ferromagnetic state to the ferromagnetic state.

In one embodiment, the ferromagnetic-to-non-ferromagnetic transition voltage Vt_fn corresponds to a positive voltage applied to the first electrode 40. The non-ferromagnetic-to-ferromagnetic transition voltage Vt_nf corresponds to a negative voltage applied to the first electrode 40.

In one embodiment, the ferromagnetic-to-non-ferromagnetic transition voltage Vt_fn may be in a range from 100 mV to 5 V, such as from 300 mV to 3 V, although lesser and greater voltages can also be employed. The non-ferromagnetic-to-ferromagnetic transition voltage Vt of may be in a range from −100 mV to −5 V, such as from −300 mV to −3V, although lesser and greater voltages can also be employed. The sense voltage for determining the magnetic state of the electric field-modulated magnetic transition layer 50 can have a magnitude that is less than the magnitude of the ferromagnetic-to-non-ferromagnetic transition voltage Vt_fn, and is less than the magnitude of the non-ferromagnetic-to-ferromagnetic transition voltage Vt_nf, such as 50 mV to 300 mV. The minimum voltage to change the polarization to the ferroelectric insulator layer 60 may be 200 mV to 500 mV.

Referring to FIGS. 3C and 3D, a method of operating a magnetoresistive memory device according to the first embodiment of the present disclosure is illustrated. FIG. 3C illustrates a state in which a first voltage applied to the first electrode 40 is more negative than a second voltage applied to the second electrode 70. The ferroelectric polarization P within the ferroelectric insulator layer 60 points away from the interface with the electric field-modulated magnetic transition layer 50, and positive surface charges are present within a surface region of the ferroelectric insulator layer 60 in proximity to the interface with the electric field-modulated magnetic transition layer 50.

FIG. 3D illustrates a state in which a first voltage applied to the first electrode 40 is more positive than a second voltage applied to the second electrode 70. The ferroelectric polarization P within the ferroelectric insulator layer 60 points toward from the interface with the electric field-modulated magnetic transition layer 50, and negative surface charges are present within a surface region of the ferroelectric insulator layer 60 in proximity to the interface with the electric field-modulated magnetic transition layer 50.

The polarization in the ferroelectric insulator layer 60 holds the applied electric field (nonvolatile in nature) on the electric field-modulated magnetic transition layer 50 after the applied voltage to the electrodes is switched off. Thus, the ferroelectric insulator layer 60 polarization assists the retention of the programmed magnetic state of the electric field-modulated magnetic transition layer 50 after the applied voltage to the electrodes is switched off.

Figure 3E:
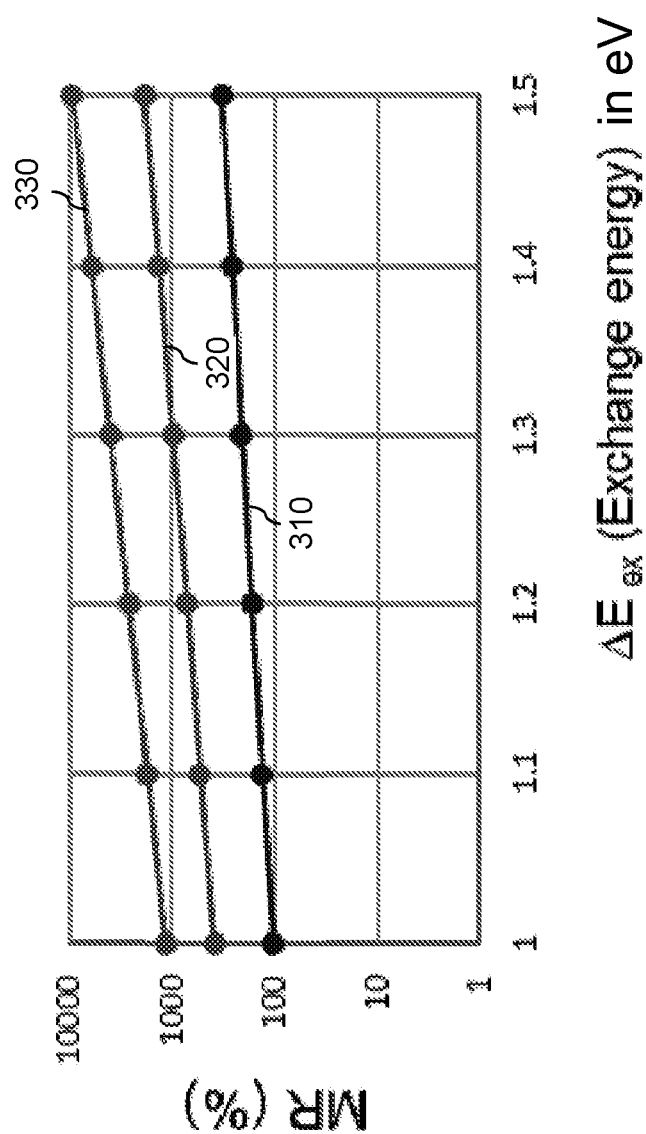
FIG. 3E illustrates the dependence of magnetoresistance in the first exemplary magnetoresistive memory cell on the exchange energy for three different thicknesses of the electric field-modulated magnetic transition layer in a ferromagnetic state according to the first embodiment of the present disclosure.

Referring to FIG. 3E, simulation results for percentage magnetoresistance MR are plotted as a function of exchange coupling energy $\Delta E_{ex}$ for various thicknesses of the electric field-modulated magnetic transition layer 50, which may comprise manganese doped gallium arsenide. The ferroelectric insulator layer 60 may have a thickness of 2 to 4 monolayers of unit cells (e.g., 2 to 4 lattice parameters having a total thickness of about 1 nm to about 2 nm). The percentage magnetoresistance MR is defined as the ratio of the difference between the resistance of the high resistance (i.e., resistivity) state and the resistance of the low resistance (i.e., resistivity) of the magnetoresistive memory cell to the resistance of the low resistance of the magnetoresistive memory cell. Curve 310 corresponds to 3 monolayers of unit cells (corresponding to about 1 nm to about 1.4 nm in total thickness) the electric field-modulated magnetic transition layer 50, curve 320 corresponds to 5 monolayers of unit cells (corresponding to about 1.8 nm to 2.2 nm in total thickness) of the electric field-modulated magnetic transition layer 50, and curve 330 corresponds to 7 monolayers of unit cells (corresponding to about 2.5 nm to about 2.9 nm in total thickness) of the electric field-modulated magnetic transition layer 50. Generally, the percentage magnetoresistance (MR) can be in a range from 100% to 10,000% depending on the thickness and the material of the electric field-modulated magnetic transition layer 50. Thus, an MR of 1,000% or greater, such as 1,000% to 10,000%, including 5,000% to 10,000% may be achieved at room temperature (e.g., 20 degrees Celsius).

Generally, the magnetoresistive memory devices of a first embodiment of the present disclosure can be provided by forming a layer stack including a first electrode 40, an electric field-modulated magnetic transition layer 50, a ferroelectric insulator layer 60, and a second electrode 70 in a forward order or in a reverse order. An array of magnetoresistive memory cells 100 can be formed on an array of metal interconnect structures such as first electrically conductive layers 30. Within each magnetoresistive memory cell 100, the first electrode 40 comprises either a separate non-magnetic metallic layer located on the respective first electrically conductive layer 30, or a portion of the respective first electrically conductive layer 30. The second electrode 70 comprises either a separate non-magnetic metallic layer located under the respective second electrically conductive layer 90, or a portion of the respective second electrically conductive layer 90. The electric field-modulated magnetic transition layer 50 comprises a non-metallic magnetic material having a ferromagnetic state and a non-ferromagnetic state with a state transition therebetween that depends on an external electric field.

In one embodiment, the non-metallic magnetic material comprises a semiconductor material, such as a III-V compound semiconductor material, a lanthanide chalcogenide semiconductor material, or a doped transition metal oxide material. In one embodiment, the ferroelectric insulator layer 60 comprises hafnium oxide or zirconium doped hafnium oxide having a ferroelectric non-centrosymmetric orthorhombic phase.

In one embodiment, the non-metallic magnetic material is in the non-ferromagnetic state under a condition in which remanent polarization within the ferroelectric insulator layer 60 points toward the electric field-modulated magnetic transition layer 50, and the non-metallic magnetic material is in the ferromagnetic state under a condition in which the remanent polarization within the ferroelectric insulator layer 60 points away from the electric field-modulated magnetic transition layer 50.

Alternatively, the non-metallic magnetic material is in the non-ferromagnetic state under a condition in which remanent polarization within the ferroelectric insulator layer 60 points away from the electric field-modulated magnetic transition layer 50, and the non-metallic magnetic material is in the ferromagnetic state under a condition in which the remanent polarization within the ferroelectric insulator layer 60 points toward the electric field-modulated magnetic transition layer 50.

Generally, the non-metallic magnetic material can be in the non-ferromagnetic state under a condition in which remanent polarization within the ferroelectric insulator layer 60 points along a first direction toward, or away from, the electric field-modulated magnetic transition layer 50, and the non-metallic magnetic material can be in the ferromagnetic state under a condition in which the remanent polarization within the ferroelectric insulator layer 60 points along a second direction that is antiparallel to the first direction.

In one embodiment, the magnetoresistive memory device 100A is in a lower resistance state when the non-metallic magnetic material is in the ferromagnetic state, and the magnetoresistive memory device is in a higher resistance state when the non-metallic magnetic material is in the non-ferromagnetic state. The non-metallic magnetic material has a split conduction band in the ferromagnetic state, and the non-ferromagnetic state comprises a paramagnetic state, a diamagnetic state, or an antiferromagnetic state.

In one embodiment, the external electric field is generated by applying a voltage between the first electrode 40 and the second electrode 70. The electric field-modulated magnetic transition layer 50 is configured to function as a tunnel barrier between the first electrode and the second electrode. The ferroelectric insulator layer 60 contacts the non-metallic magnetic material, such that the ferroelectric insulator layer is configured to hold the applied electric field after the voltage is switched off such that the state of the electric field-modulated magnetic transition layer is nonvolatile.

In one embodiment, a method of programming the device 100A comprises inducing a state transition between the ferromagnetic state and the non-ferromagnetic state in the electric field-modulated magnetic transition layer 50 by applying a voltage between the first electrode and the second electrode to generate the electric field. In one embodiment, the first electrode 40 is located adjacent to the electric field-modulated magnetic transition layer 50, such that the electric field-modulated magnetic transition layer is located between the ferroelectric insulator layer 60 and the first electrode 40. The second electrode 70 is located adjacent to the ferroelectric insulator layer 60, such that the ferroelectric insulator layer is located between the electric field-modulated magnetic transition layer 50 and the second electrode 70. In one embodiment, inducing the state transition in the electric field-modulated magnetic transition layer comprises changing the state of the non-metallic magnetic material of the electric field-modulated magnetic transition layer 50 from the ferromagnetic state to the non-ferromagnetic state by applying a more positive voltage to the first electrode 40 than to the second electrode 70, and changing the state of the non-metallic magnetic material of the electric field-modulated magnetic transition layer from the non-ferromagnetic state to the ferromagnetic state by applying a more negative voltage to the first electrode than to the second electrode. Since the non-metallic magnetic material has a split conduction band in the ferromagnetic state, the lower conduction band has a lower energy than the conduction band in the paramagnetic state, such that the tunnel barrier height is lower in the ferromagnetic state than in the paramagnetic state.

Figure 4A:
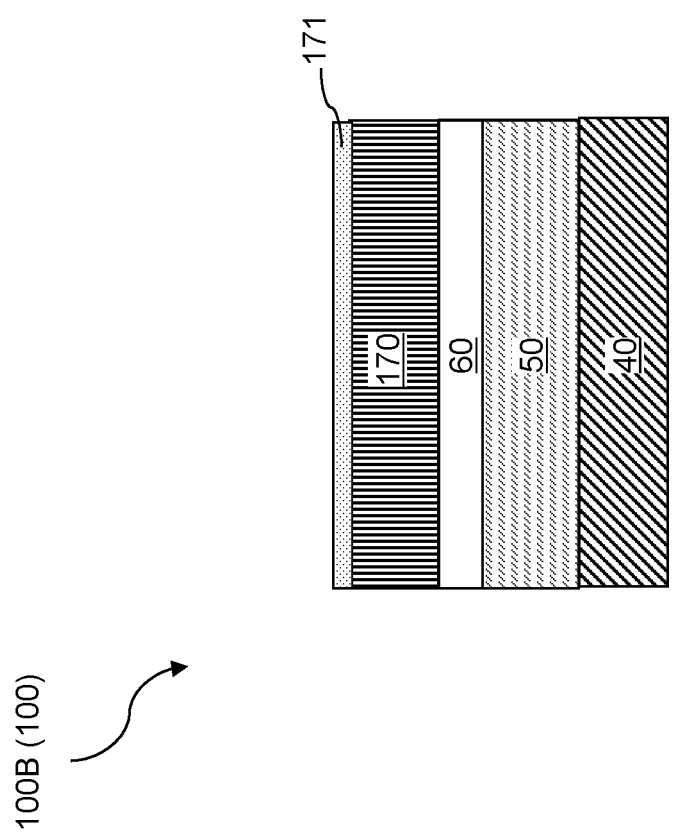
FIG. 4A illustrates a second exemplary magnetoresistive memory cell according to a second embodiment of the present disclosure.

In a second embodiment of the present disclosure, the memory cell comprises an electric field controllable quasi-magnetic tunnel junction (QMTJ) that contains a ferromagnetic electrode. Referring to FIG. 4A, a second exemplary magnetoresistive memory cell 100B according to the second embodiment of the present disclosure is illustrated, which can be derived from the first exemplary magnetoresistive memory cell 100A by replacing the non-magnetic second electrode 70 with a second electrode 170 including a ferromagnetic material. For example, in the second electrode 170 can include CoFe, CoFeB, NiFe, or NiFeB. In general, the cell 100B of the second embodiment contains one ferromagnetic electrode.

In one aspect of the second embodiment, an antiferromagnetic coupling spacer 171 can be provided on the second electrode 170. The antiferromagnetic coupling spacer 171 can include an antiferromagnetic coupling material such as ruthenium, iridium, iridium-manganese alloy or a multilayer stack of cobalt and platinum layers, and can have a thickness in a range from 0.5 nm to 2 nm. In one embodiment, the antiferromagnetic coupling spacer 171 is a part of a synthetic antiferromagnetic structure (SAF structure), which fixes the magnetization direction (i.e., spin direction) of the ferromagnetic second electrode 170. For example, the magnetization (i.e., spin) direction of the ferromagnetic second electrode 170 may be fixed in the "up" direction, as shown in FIGS. 4B to 4D. However, the direction may alternatively be fixed in the "down" direction.

In the second embodiment, the ferromagnetic state of the electric field-modulated magnetic transition layer 50 is changed by application of an electric field (i.e., voltage), such that the spin direction in the lower split conduction band is either parallel or antiparallel to the spin direction in the ferromagnetic second electrode 170. In this embodiment, the ferroelectric insulator layer 60 acts as gate barrier and magnetically decouples the ferromagnetic second electrode 170 from the electric field-modulated magnetic transition layer 50. The second exemplary magnetoresistive memory cell 100B can achieve the two resistance states (nonvolatile states) by changing the polarity of the applied electric field without any magnetic field.

As shown in FIG. 4C, when the spin direction (i.e., magnetization direction) of electrons in the lower split conduction band of the electric field-modulated magnetic transition layer 50 is parallel to the spin direction (i.e., magnetization direction) of the electrons in the ferromagnetic second electrode 170 (e.g., both have the "spin up" state), the memory cell 100B is in the lower resistance (e.g., resistivity) state because the tunneling barrier height for the electrons in the spin up state is lower. In this configuration, the polarization direction in the ferroelectric insulator layer 60 points away from the interface with the electric field-modulated magnetic transition layer 50.

As shown in FIG. 4D, when the spin direction (i.e., magnetization direction) of electrons in the lower split conduction band of the electric field-modulated magnetic transition layer 50 is antiparallel to the spin direction (i.e., magnetization direction) of the electrons in the ferromagnetic second electrode 170 (e.g., the electrons in layer 50 have a "spin down" state while the electrons in the second electrode 170 have the "spin up" state), the memory cell 100B is in the higher resistance (e.g., resistivity) state because the tunneling barrier height for the electrons in the spin up state is higher. In this configuration, the polarization direction in the ferroelectric insulator layer 60 points toward the interface with the electric field-modulated magnetic transition layer 50.

By changing the applied voltage polarity, the magnetic state of the electric field-modulated magnetic transition layer 50 can be deterministically reversed and hence the device resistance state can be modulated between the high and low resistance states. Since the ferroelectric polarization states of the ferroelectric insulator layer 60 can be retained even after turning off the applied voltage, the resistance state of electric field controlled QMTJ is nonvolatile in nature. The QMTJ type devices can act as conventional magnetic tunnel junctions, where instead of magnetic field or current, a voltage (e.g., electric field generated by a voltage) can be used to achieve the two resistance states. Unlike VCMA-MTJ type devices, such resistance states are deterministic in nature.

Figure 4E:
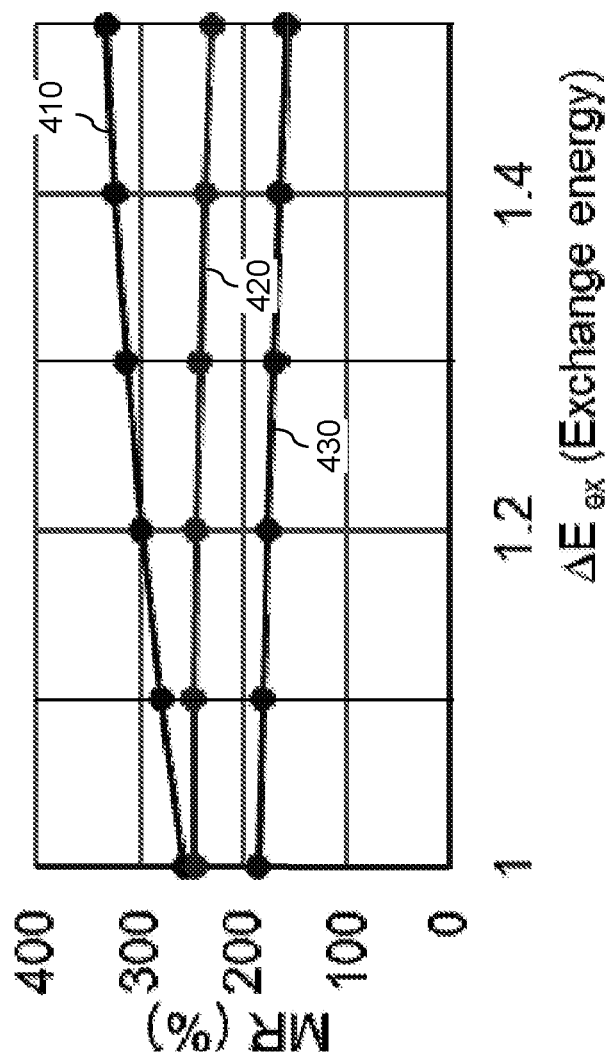
FIG. 4E illustrates the dependence of magnetoresistance in the second exemplary magnetoresistive memory cell on the exchange energy for three different thicknesses of the electric field-modulated magnetic transition layer in a ferromagnetic state according to the second embodiment of the present disclosure.

Referring to FIG. 4E, simulation results for percentage magnetoresistance MR are plotted as a function of exchange coupling energy $\Delta E_{ex}$ for various thicknesses of the electric field-modulated magnetic transition layer 50. The simulation assumes 2~4 monolayers of unit cells for the ferroelectric insulator layer 60 (corresponding to a thickness of in a range from 1 nm to 2 nm for hafnium oxide or zirconium doped hafnium oxide having a ferroelectric non-centrosymmetric orthorhombic phase), and different number of monolayers of unit cells of the electric field-modulated magnetic transition layer 50. Curve 410 corresponds to 3 monolayers of unit cells of layer 50, curve 420 corresponds to 5 monolayers of unit cells of layer 50, and curve 430 corresponds to 7 monolayers of unit cells of layer 50. Generally, the percentage magnetoresistance MR can be in a range from 150% to 330% depending on the thickness and the material of the electric field-modulated magnetic transition layer 50.

Thus, in the second embodiment, the first electrode 40 comprises a nonmagnetic metallic material, the non-metallic magnetic material of the electric field-modulated magnetic transition layer 50 has a split conduction band in a ferromagnetic state, the external electric field is generated by applying a voltage between the first electrode 40 and the second electrode 170, and the electric field-modulated magnetic transition layer is configured to function as a tunnel barrier between the first electrode and the second electrode. In one embodiment, the magnetic state transition that depends on the external electric field comprises a transition between a first state in which a magnetization direction in the lower split conduction band is parallel to a magnetization direction of the second electrode 170, and a second state in which the magnetization direction in the lower split conduction band is antiparallel to the magnetization of the second electrode 170. The magnetoresistive memory device 100B is in a lower resistance state when the magnetization direction in the lower split conduction band is parallel to a magnetization direction of the second electrode 170, and the magnetoresistive memory device 100B is in a higher resistance state when the magnetization direction in the lower split conduction band is antiparallel to a magnetization direction of the second electrode 170.

Figure 5A:
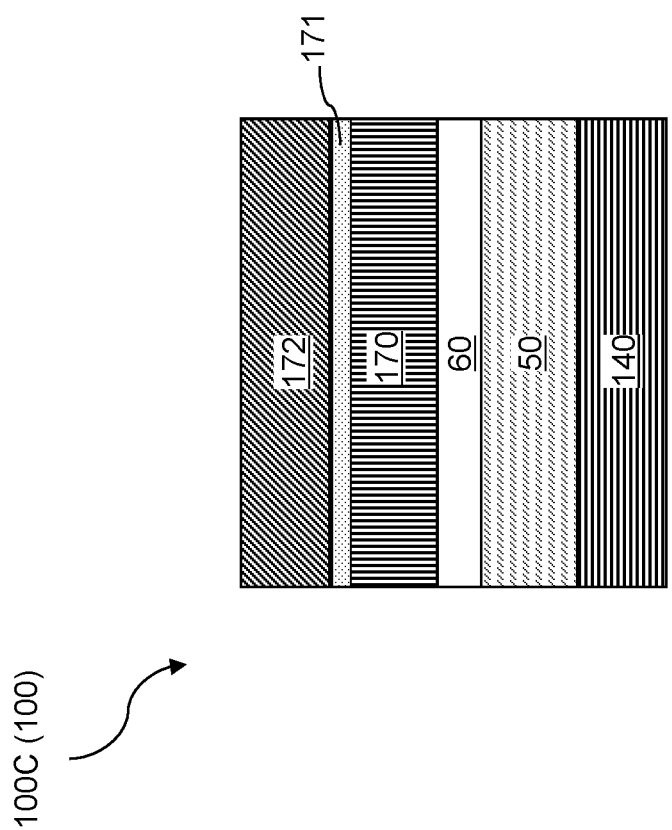
FIG. 5A illustrates a third exemplary magnetoresistive memory cell according to a third embodiment of the present disclosure.

In a third embodiment of the present disclosure, the memory cell comprises an electric field controllable fully magnetic tunnel junction (FMTJ) that contains two ferromagnetic electrodes. Referring to FIG. 5A, a third exemplary magnetoresistive memory cell 100C according to the third embodiment of the present disclosure can be derived from the second exemplary magnetoresistive memory cell 100B by replacing the first electrode 40 with a first electrode 140 including a ferromagnetic material. By using two ferromagnetic electrodes with the electric field-modulated magnetic transition layer 50 three or more resistance (e.g., resistivity) states may be achieved. Depending upon the magnetic configuration (i.e., magnetization direction) of ferromagnetic electrode that corresponds to a "free layer" of the memory cell, and the magnetization direction of the electric field-modulated magnetic transition layer 50, five different resistance (e.g., resistivity) states may be achieved.

The third exemplary magnetoresistive memory cell 100C includes a magnetoresistive memory device, which contains a first electrode 140 comprising a first ferromagnetic metal, a second electrode 170 comprising a second ferromagnetic metal and spaced from the first electrode 140, and a layer stack (50, 60) including the electric field-modulated magnetic transition layer 50 and the ferroelectric insulator layer 60, described in the first and second embodiments.

In one embodiment, the antiferromagnetic coupling spacer 171 described above in the second embodiment may be located on the second electrode 170. An optional hard ferromagnetic layer 172 may be located on the antiferromagnetic coupling spacer 171, such that the combination of the second electrode 170, the antiferromagnetic coupling spacer 171, and the optional hard ferromagnetic layer 172 comprises a synthetic antiferromagnetic (SAF) structure that provides stabilized fixed magnetization for the second electrode 170. In this embodiment, the second electrode 170 corresponds to a reference layer (i.e., fixed magnetization layer), while the first electrode 140 corresponds to a free layer of a spin transfer torque (STT) type MRAM device. In other words, the magnetization direction of the second electrode 170 is fixed, while the magnetization direction of the first electrode 140 may vary based on the applied spin polarized current. Thus, the combination of the first electrode 140, the layer stack (50, 60), and the second electrode 170 comprises a magnetic tunnel junction (MTJ) structure in which the second electrode 170 functions as a reference layer and the first electrode 140 functions as a free layer. The first electrode 140 may have a lower coercivity than the second electrode 170. In contrast, the magnetization direction and the magnetic state of the electric field-modulated magnetic transition layer 50 is controlled by an electric field due to the applied voltage and the polarization of the adjacent ferroelectric insulator layer 60 after the applied voltage is switched off. Thus, the memory cell 100C of the third embodiment is a combination of a STT-MRAM and a SFTJ-MRAM.

Figure 5B:
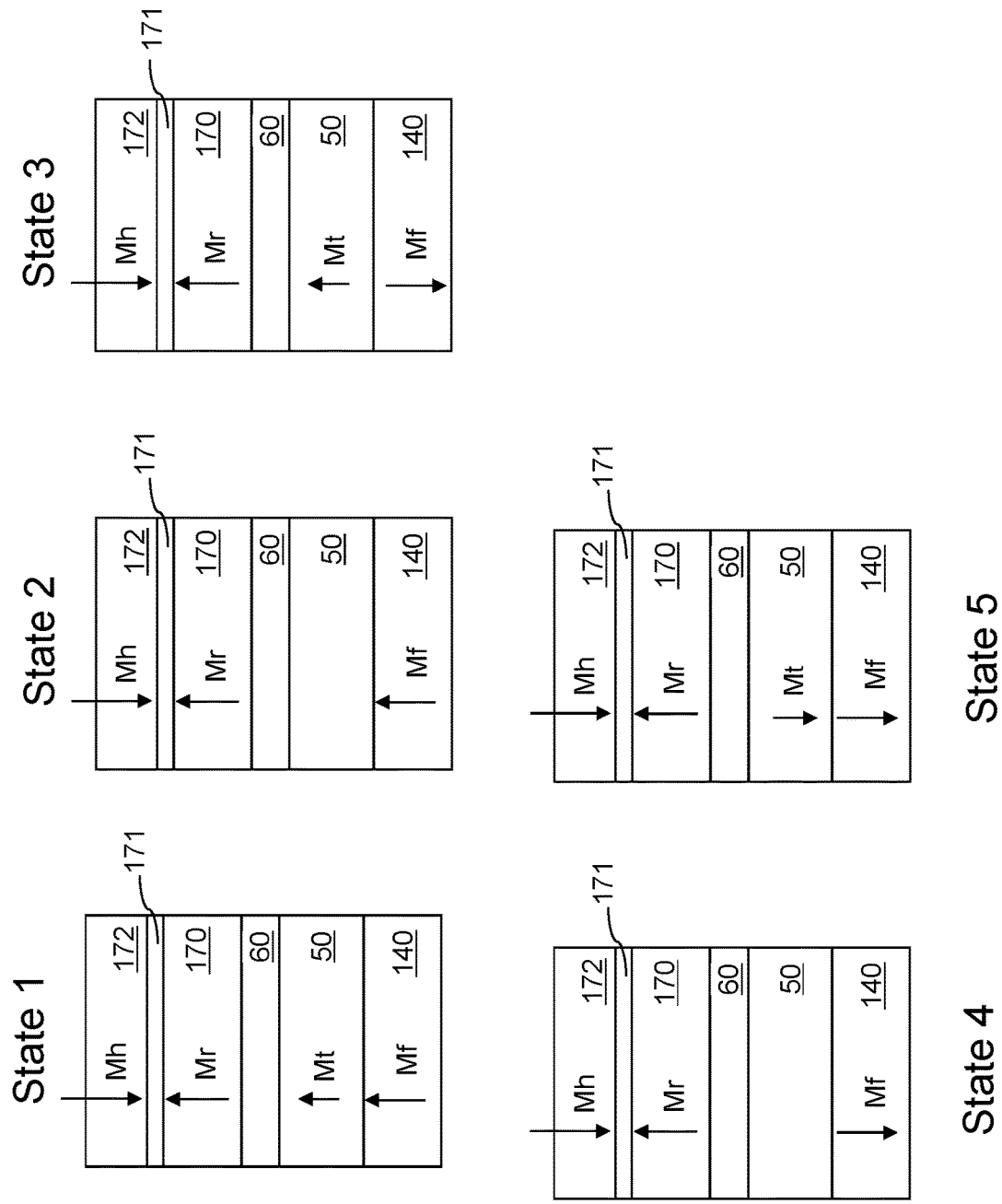
FIG. 5B illustrates various magnetoresistive states that may be formed within the third exemplary magnetoresistive memory cell according to the third embodiment of the present disclosure.

The third exemplary magnetoresistive memory cell 100C can have more than two magnetoresistive states depending on current and past values of the relative voltage between the first electrode 140 and the second electrode 170. FIG. 5B illustrates various magnetoresistive states that may be formed within the third exemplary magnetoresistive memory cell 100C according to the third embodiment of the present disclosure. The magnetization direction (Mr) of the reference layer (i.e., second electrode) 170 is fixed in an antiparallel direction to the magnetization direction (Mh) of the hard layer 172.

In the first magnetoresistive state, the magnetization direction (Mr) of the reference layer (i.e., second electrode) 170 and the magnetization direction (Mf) of the free layer (i.e., the first electrode) 140 are parallel to each other. The electric field-modulated magnetic transition layer 50 is programmed into the ferromagnetic state in which the magnetization direction (Mt) in the lower split conduction band of the transition layer 50 is parallel to the magnetization directions (Mf, Mr) of the free layer 140 and the reference layer 170. In other words, the magnetization directions of the reference layer 170 and the electric field-modulated magnetic transition layer 50 are the same as those shown in FIG. 4C.

In the second magnetoresistive state, the magnetization direction (Mr) of the reference layer (i.e., second electrode) 170 and the magnetization direction (Mf) of the free layer (i.e., the first electrode) 140 are parallel to each other. The electric field-modulated magnetic transition layer 50 is programmed into the non-ferromagnetic state (such as a paramagnetic state, a diamagnetic state or an antiferromagnetic state) shown in FIG. 3D.

In the third magnetoresistive state, the magnetization direction (Mr) of the reference layer (i.e., second electrode) 170 and the magnetization direction (Mf) of the free layer (i.e., the first electrode) 140 are antiparallel to each other. The electric field-modulated magnetic transition layer 50 is programmed into the ferromagnetic state in which the magnetization direction (Mt) in the lower split conduction band of the transition layer 50 is parallel to the magnetization direction (Mr) of the reference layer 170. In other words, the magnetization directions of the reference layer 170 and the electric field-modulated magnetic transition layer 50 are the same as those shown in FIG. 4C.

In the fourth magnetoresistive state, the magnetization direction (Mr) of the reference layer (i.e., second electrode) 170 and the magnetization direction (Mf) of the free layer (i.e., the first electrode) 140 are antiparallel to each other. The electric field-modulated magnetic transition layer 50 is programmed into the non-ferromagnetic state (such as a paramagnetic state, a diamagnetic state or an antiferromagnetic state) shown in FIG. 3D.

In the fifth magnetoresistive state, the magnetization direction (Mr) of the reference layer (i.e., second electrode) 170 and the magnetization direction (Mf) of the free layer (i.e., the first electrode) 140 are antiparallel to each other. The electric field-modulated magnetic transition layer 50 is programmed into the ferromagnetic state in which the magnetization direction (Mt) in the lower split conduction band of the transition layer 50 is antiparallel to the magnetization direction (Mr) of the reference layer 170. In other words, the magnetization directions of the reference layer 170 and the electric field-modulated magnetic transition layer 50 are the same as those shown in FIG. 4D.

In one embodiment, the resistance (e.g., resistivity) of the magnetoresistive states may increase sequentially from the first magnetoresistive state (i.e., lowest resistance) to the fifth magnetoresistive state (i.e., highest resistance).

Figure 5C:
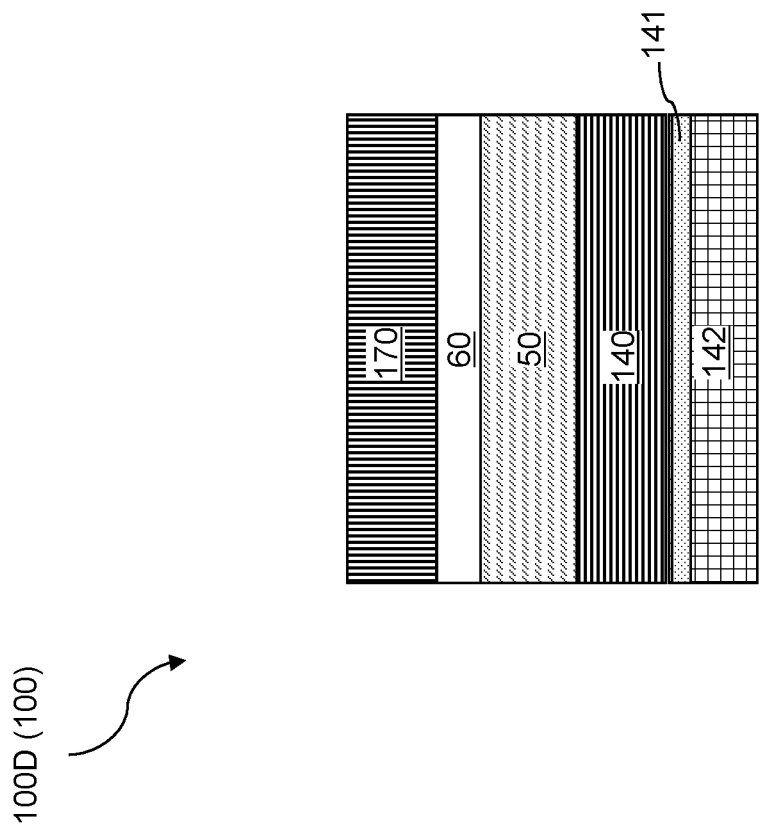
FIG. 5C is an alternative embodiment of the third exemplary magnetoresistive memory cell according to the second embodiment of the present disclosure.

Referring to FIG. 5C, an alternative embodiment of the third exemplary magnetoresistive memory cell 100C according to the third embodiment of the present disclosure is illustrated. The alternative embodiment cell 100D can be derived from the third exemplary magnetoresistive memory cell 100C by forming a synthetic antiferromagnetic (SAF) structure on the side of the first electrode 140. In this case, the first electrode 140 becomes the reference layer having a fixed magnetization, and the second electrode 170 becomes the free layer of a magnetic tunnel junction structure.

Specifically, an antiferromagnetic coupling spacer 141 can be provided on the first electrode 140 and a hard ferromagnetic layer 142 can be provided on the antiferromagnetic coupling spacer 141. The combination of the first electrode 140, the antiferromagnetic coupling spacer 141, and the hard ferromagnetic layer 142 comprises a synthetic antiferromagnetic (SAF) structure that provides stabilized fixed magnetization for the first electrode 140. The alternative embodiment memory cell 100D can be operated in the same manner as the third exemplary magnetoresistive memory cell 100C, and may provide up to five magnetic states.

Generally, the first electrode 140 can include a first ferromagnetic metal, and the second electrode 170 can include a second ferromagnetic metal. One of the first ferromagnetic metal and the second ferromagnetic metal can have a higher coercivity than the other of the first ferromagnetic metal and the second ferromagnetic metal. In one embodiment, the second ferromagnetic metal has a higher coercivity than the first ferromagnetic metal. Alternatively, the first ferromagnetic metal can have a higher coercivity than the second ferromagnetic metal. The ferromagnetic metal with a lower coercivity can be employed as the free layer, and the ferromagnetic metal with a higher coercivity can be employed as the reference layer.

The third exemplary magnetoresistive memory cell 100C or the alternative embodiment memory cell 100D can be programmed by inducing a state transition between the ferromagnetic state and the non-ferromagnetic state in the electric field-modulated magnetic transition layer 50 using an electric field generated by applying an electrical bias voltage between the first electrode 140 and the second electrode 170. The third exemplary magnetoresistive memory cell 100C or the alternative embodiment memory cell 100D can also be programmed by switching the magnetization direction in the lower split conduction band of the electric field-modulated magnetic transition layer 50 between parallel and antiparallel direction with respect to the magnetization direction of the second electrode 170 using an electric field generated by applying a voltage between the two electrodes. Furthermore, the third exemplary magnetoresistive memory cell 100C or the alternative embodiment memory cell 100D can also be programmed by switching the magnetization direction of the free layer between parallel and antiparallel direction with respect to the magnetization direction of the second electrode 170 using a spin polarized current provided in opposite directions between the electrodes, similar to the STT-MRAM programming.

In one embodiment, the applied voltage used to generate the electric field may also generate the spin polarized current, such that the magnetization direction of the free layer is set at the same time as the magnetic state of the electric field-modulated magnetic transition layer 50, depending on the composition and thicknesses of the layers of the memory cell (100C, 100D). Alternatively, the spin polarized current may be applied separately from the voltage used to generate the electric field, such that the electric field-modulated magnetic transition layer 50 is programmed by applying a voltage which generates the electric field, while the magnetization direction of the free layer is set during a different programming step that applies a different voltage or current from the voltage used to program layer 50.

For example, a lower voltage magnitude may be used to program the free layer (i.e., to set the magnetization state of the free layer) than a magnitude of the voltage used to program the electric field-modulated magnetic transition layer 50 (e.g., to switch the electric field-modulated magnetic transition layer 50 between the ferromagnetic and the non-ferromagnetic states) if the free layer has a lower coercivity than the electric field-modulated magnetic transition layer 50.

Alternatively, a higher voltage magnitude may be used to program the free layer (i.e., to set the magnetization state of the free layer) than a magnitude of the voltage used to program the electric field-modulated magnetic transition layer 50 (e.g., to switch the electric field-modulated magnetic transition layer 50 between the ferromagnetic and the non-ferromagnetic states) if the free layer has a higher coercivity than the electric field-modulated magnetic transition layer 50.

Thus, in the third embodiment, the first electrode 140 comprises a ferromagnetic metallic material which has a lower coercivity than the ferromagnetic metallic material of the second electrode 170, and the non-metallic magnetic material of the electric field-modulated magnetic transition layer 50 has a split conduction band in a ferromagnetic state, and also has a non-ferromagnetic state with a state transition between the ferromagnetic state and the non-ferromagnetic state that depends on the external electric field. The external electric field is generated by applying a voltage between the first electrode and the second electrode, and the electric field-modulated magnetic transition layer 50 is configured to function as a tunnel barrier between the first electrode 140 and the second electrode 170.

In one embodiment, the magnetoresistive memory device 100C has at least three different magnetoresistive memory states having a different resistance from each other, the first electrode 140 has a changeable magnetization direction and is configured to function as a free layer; and the second electrode 170 has a fixed magnetization direction and is configured to function as a reference layer.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetoresistive memory device, comprising:
   a first electrode;
   a second electrode comprising a ferromagnetic metallic material; and
   a layer stack including an electric field-modulated magnetic transition layer and a ferroelectric insulator layer, wherein the electric field-modulated magnetic transition layer includes a non-metallic magnetic material which has a magnetic state transition that depends on an external electric field.

2. The magnetoresistive memory device of claim 1, wherein the non-metallic magnetic material comprises a semiconductor material or an insulating material.

3. The magnetoresistive memory device of claim 2, wherein the non-metallic magnetic material comprises a III-V compound semiconductor material.

4. The magnetoresistive memory device of claim 3, wherein the non-metallic magnetic material comprises manganese-doped gallium arsenide.

5. The magnetoresistive memory device of claim 2, wherein the non-metallic magnetic material comprises a lanthanide chalcogenide semiconductor material.

6. The magnetoresistive memory device of claim 1, wherein the non-metallic magnetic material comprises a doped transition metal oxide material.

7. The magnetoresistive memory device of claim 1, wherein the ferroelectric insulator layer comprises hafnium oxide, zirconium doped hafnium oxide, barium titanate, bismuth ferrite, lead titanate, or lead zirconate titanate.

8. The magnetoresistive memory device of claim 1, further comprising an antiferromagnetic coupling spacer located on the second electrode.

9. The magnetoresistive memory device of claim 8, wherein:
   the first electrode comprises a nonmagnetic metallic material;
   the non-metallic magnetic material has a split conduction band in a ferromagnetic state;
   the external electric field is generated by applying a voltage between the first electrode and the second electrode; and
   the electric field-modulated magnetic transition layer is configured to function as a tunnel barrier between the first electrode and the second electrode.

10. The magnetoresistive memory device of claim 9, wherein:
    the magnetic state transition that depends on the external electric field comprises a transition between a first state in which a magnetization direction in the lower split conduction band is parallel to a magnetization direction of the second electrode, and a second state in which the magnetization direction in the lower split conduction band is antiparallel to the magnetization of the second electrode.

11. The magnetoresistive memory device of claim 9, wherein:
    the magnetoresistive memory device is in a lower resistance state when the magnetization direction in the lower split conduction band is parallel to a magnetization direction of the second electrode; and
    the magnetoresistive memory device is in a higher resistance state when the magnetization direction in the lower split conduction band is antiparallel to a magnetization direction of the second electrode.

12. The magnetoresistive memory device of claim 8, wherein:
    the first electrode comprises a ferromagnetic metallic material which has a lower coercivity than the ferromagnetic metallic material of the second electrode;
    the non-metallic magnetic material has a split conduction band in a ferromagnetic state and also has a non-ferromagnetic state with a state transition between the ferromagnetic state and the non-ferromagnetic state that depends on the external electric field;
    the external electric field is generated by applying a voltage between the first electrode and the second electrode; and
    the electric field-modulated magnetic transition layer is configured to function as a tunnel barrier between the first electrode and the second electrode.

13. The magnetoresistive memory device of claim 12, wherein:
    the magnetoresistive memory device has at least three different magnetoresistive memory states having a different resistance from each other;
    the first electrode has a changeable magnetization direction and is configured to function as a free layer; and
    the second electrode has a fixed magnetization direction and is configured to function as a reference layer.

14. The magnetoresistive memory device of claim 13, wherein the magnetoresistive memory device has five magnetoresistive states comprising:
    a first magnetoresistive state in which the magnetization direction of the reference layer and the magnetization direction of the free layer are parallel to each other, and the electric field-modulated magnetic transition layer is in the ferromagnetic state in which the magnetization direction in a lower split conduction band is parallel to the magnetization direction of the reference layer;
    a second magnetoresistive state in which the magnetization direction of the reference layer and the magnetization direction of the free layer are parallel to each other, and the electric field-modulated magnetic transition layer is in the non-ferromagnetic state;
    a third magnetoresistive state in which the magnetization direction of the reference layer and the magnetization direction of the free layer are antiparallel to each other, and the electric field-modulated magnetic transition layer is in the ferromagnetic state in which the magnetization direction in the lower split conduction band is parallel to the magnetization direction of the reference layer;
    a fourth magnetoresistive state in which the magnetization direction of the reference layer and the magnetization direction of the free layer are antiparallel to each other, and the electric field-modulated magnetic transition layer is in the non-ferromagnetic state; and a fifth magnetoresistive state in which magnetization direction of the reference layer and the magnetization direction of the free layer are antiparallel to each other, and the electric field-modulated magnetic transition layer is in the ferromagnetic state in which the magnetization direction in the lower split conduction band is antiparallel to the magnetization direction of the reference layer.

15. A method of programming a magnetoresistive memory device, comprising:
    providing the magnetoresistive memory device of claim 1; and
    inducing the magnetic state transition in the electric field-modulated magnetic transition layer by applying a voltage between the first electrode and the second electrode to generate the external electric field.

16. The method of claim 15, wherein:
    the first electrode comprises a nonmagnetic metallic material;
    the non-metallic magnetic material has a split conduction band in a ferromagnetic state; and
    the electric field-modulated magnetic transition layer is configured to function as a tunnel barrier between the first electrode and the second electrode.

17. The method of claim 16, wherein inducing the magnetic state transition comprises inducing a transition between a first state in which a magnetization direction in the lower split conduction band is parallel to a magnetization direction of the second electrode, and a second state in which the magnetization direction in the lower split conduction band is antiparallel to the magnetization of the second electrode.

18. The method of claim 17, wherein:
    the magnetoresistive memory device is in a lower resistance state when the magnetization direction in the lower split conduction band is parallel to a magnetization direction of the second electrode; and
    the magnetoresistive memory device is in a higher resistance state when the magnetization direction in the lower split conduction band is antiparallel to a magnetization direction of the second electrode.

19. The method of claim 15, wherein:
    the first electrode comprises a ferromagnetic metallic material which has a lower coercivity than the ferromagnetic metallic material of the second electrode;
    the non-metallic magnetic material has a split conduction band in a ferromagnetic state and also has a non-ferromagnetic state with the magnetic state transition between the ferromagnetic state and the non-ferromagnetic state that depends on the external electric field;
    the electric field-modulated magnetic transition layer is configured to function as a tunnel barrier between the first electrode and the second electrode;
    the magnetoresistive memory device has at least three different magnetoresistive memory states having a different resistance from each other;
    the first electrode has a changeable magnetization direction and is configured to function as a free layer; and
    the second electrode has a fixed magnetization direction and is configured to function as a reference layer.

20. The method of claim 19, wherein inducing the magnetic state transition comprises inducing a transition between any two or more of:
    a first magnetoresistive state in which the magnetization direction of the reference layer and the magnetization direction of the free layer are parallel to each other, and the electric field-modulated magnetic transition layer is in the ferromagnetic state in which the magnetization direction in a lower split conduction band is parallel to the magnetization direction of the reference layer;
    a second magnetoresistive state in which the magnetization direction of the reference layer and the magnetization direction of the free layer are parallel to each other, and the electric field-modulated magnetic transition layer is in the non-ferromagnetic state;
    a third magnetoresistive state in which the magnetization direction of the reference layer and the magnetization direction of the free layer are antiparallel to each other, and the electric field-modulated magnetic transition layer is in the ferromagnetic state in which the magnetization direction in the lower split conduction band is parallel to the magnetization direction of the reference layer;
    a fourth magnetoresistive state in which the magnetization direction of the reference layer and the magnetization direction of the free layer are antiparallel to each other, and the electric field-modulated magnetic transition layer is in the non-ferromagnetic state; and
    a fifth magnetoresistive state in which magnetization direction of the reference layer and the magnetization direction of the free layer are antiparallel to each other, and the electric field-modulated magnetic transition layer is in the ferromagnetic state in which the magnetization direction in the lower split conduction band is antiparallel to the magnetization direction of the reference layer.

* * * * *